(12) United States Patent
Kuznetsov et al.

(10) Patent No.: US 12,553,130 B2
(45) Date of Patent: Feb. 17, 2026

(54) MULTI-CHAMBER APPARATUS AND METHOD FOR ALD

(71) Applicant: Levitech B.V., Almere (NL)

(72) Inventors: Vladimir Kuznetsov, Almere (NL); Jacobus Hubertus Maria Beijersbergen, Almere (NL); Simon Cornelis Van Der Linde, Houten (NL)

(73) Assignee: Levitech B.V., Almere (NL)

( * ) Notice: Subject to any disclaimer, the term of this patent is extended or adjusted under 35 U.S.C. 154(b) by 213 days.

(21) Appl. No.: 18/036,782

(22) PCT Filed: Nov. 11, 2021

(86) PCT No.: PCT/NL2021/050697
§ 371 (c)(1),
(2) Date: May 12, 2023

(87) PCT Pub. No.: WO2022/103266
PCT Pub. Date: May 19, 2022

(65) Prior Publication Data
US 2023/0416912 A1    Dec. 28, 2023

(30) Foreign Application Priority Data
Nov. 13, 2020 (NL) .................................... 2026895

(51) Int. Cl.
*C23C 16/455* (2006.01)
*C23C 16/458* (2006.01)
(Continued)

(52) U.S. Cl.
CPC .. *C23C 16/45544* (2013.01); *C23C 16/45529* (2013.01); *C23C 16/45551* (2013.01);
(Continued)

(58) Field of Classification Search
CPC ........ C23C 16/45544; C23C 16/45529; C23C 16/18; C23C 16/303; C23C 16/45551;
(Continued)

(56) References Cited

U.S. PATENT DOCUMENTS 4,495,024 A * 1/1985 Bok .................. H01L 21/67784
438/782
7,022,627 B2 * 4/2006 Granneman ........ H01L 21/6838
438/795
(Continued)

FOREIGN PATENT DOCUMENTS

EP         2481833 A1    8/2012
WO     2011062490 A1    5/2011
(Continued)

OTHER PUBLICATIONS

International Search Report and Written Opinion—PCT/NL2021/050697—mailing date May 19, 2022.

*Primary Examiner* — Aiden Lee
(74) *Attorney, Agent, or Firm* — Banner & Witcoff, Ltd.

(57) ABSTRACT

An atomic layer deposition apparatus comprising a first single substrate process chamber, a second single substrate process chamber, and a transfer mechanism configured to transfer the substrate between the first and the second process chamber. Wherein both the first and second single substrate process chambers are bounded by a bottom part and a top part for accommodating a substantially flat substrate between them.

23 Claims, 7 Drawing Sheets

(51) Int. Cl.
*C23C 16/46* (2006.01)
*H01L 21/677* (2006.01)

(52) U.S. Cl.
CPC ...... *C23C 16/45565* (2013.01); *C23C 16/458* (2013.01); *C23C 16/46* (2013.01); *H01L 21/67748* (2013.01); *H01L 21/67784* (2013.01)

(58) Field of Classification Search
CPC .......... C23C 16/45565; C23C 16/4586; C23C 16/46; C23C 16/54; C23C 21/67748; C23C 21/67784; C23C 21/68792; C23C 21/6719; C23C 21/6838; C23C 16/45519; C23C 16/45521; C23C 16/45525–45555; H01L 21/68792; H01L 21/6719; H01L 21/67748; H01L 21/67784; H01L 21/6838

See application file for complete search history.

(56) References Cited

U.S. PATENT DOCUMENTS

| | | | |
|---|---|---|---|
| 9,776,905 B2* | 10/2017 | Maschmeyer | C03B 29/12 |
| 2003/0027094 A1* | 2/2003 | Storm | H01L 21/00 432/5 |
| 2010/0047954 A1* | 2/2010 | Su | H01L 21/67712 118/620 |
| 2010/0221426 A1* | 9/2010 | Sferlazzo | C23C 16/46 118/724 |
| 2014/0174351 A1 | 6/2014 | Aikawa | |
| 2015/0152555 A1* | 6/2015 | Mai | H01L 21/6776 118/723 R |
| 2017/0062258 A1* | 3/2017 | Bluck | H10F 71/00 |
| 2017/0306492 A1* | 10/2017 | Iizuka | C23C 16/50 |

FOREIGN PATENT DOCUMENTS

| | | |
|---|---|---|
| WO | 2012005577 A1 | 12/2012 |
| WO | 2019151495 A1 | 8/2019 |

* cited by examiner

MULTI-CHAMBER APPARATUS AND METHOD FOR ALD

CROSS-REFERENCE TO RELATED APPLICATIONS

This application is a U.S. National Stage application under 35 U.S.C. § 371 of International Application PCT/NL2021/050697 (published as WO 2022/103266 A1), filed Nov. 11, 2021, which claims the benefit of priority to Application NL 2026895, filed Nov. 13, 2020. Benefit of the filing date of these prior applications is hereby claimed. Each of these prior applications is hereby incorporated by reference in its entirety.

FIELD

The invention relates to an Atomic Layer Deposition (ALD) apparatus, and a method for applying an ALD-film on a substrate by means of atomic layer deposition.

BACKGROUND

Atomic layer deposition (ALD) is a technique in which gas phased chemicals (precursors) react with and/or are absorbed by the surface of a substrate one at a time in a sequential, self-limiting manner. A thin film is deposited by the repeated exposure to separate precursors. The deposition rate is optimized at a certain temperature range which depends on the precursor in question. US 2007/0015374 A1 (US'374) discloses an ALD-apparatus with two parts which confine a substrate. One of the parts has a temperature which is above the optimal temperature range of the applied precursor, the other part has a temperature which is below the optimal temperature range of the applied precursor. Both parts are in close proximity of the substrate, resulting in a substrate temperature which is between the temperatures of both parts and within the optimal temperature range of the precursor in question. In this way the deposition rate on the substrate is optimized, while at the same time de deposition on the ALD-apparatus is minimized or limited.

SUMMARY

When one wants to deposit in succession a first precursor and a second precursor, the temperature of the substrate is preferably in the optimum temperature ranges of both precursors. When the optimum temperature range of the first precursor is different from the optimum temperature range of the second precursor, preferably the temperature of the substrate is changed accordingly. In the known atomic layer deposition apparatus of US'374 this means that the two parts which confine the substrate need to change in temperate, e.g. they need to be warmed up or cooled down. This may take a relatively long time to achieve a temperature change in the substrate, resulting in a reduced film deposition rate and thus in a reduced throughput of the atomic layer deposition apparatus.

The present invention has as an object to provide an atomic layer deposition apparatus which may apply different precursors at different temperatures more swiftly than the known atomic layer deposition apparatus.

To that end, the invention provides an atomic layer deposition apparatus according to claim 1. More particularly, the invention provides an atomic layer deposition apparatus comprising a first single substrate process chamber, a second single substrate process chamber, and a transfer mechanism configured to transfer the substrate between the first and the second process chambers.

The first single substrate process chamber is bounded by a first bottom part and a first top part for accommodating a substantially flat substrate between them. Upon placement of the substrate between the first bottom part and the first top part, opposite facing surfaces of the first bottom part and the first top part are parallel to each other and to two opposite main surfaces of the substrate. The first bottom part and the first top part are moveable away from and towards each other between a process position and a substrate loading/unloading-position. In the process position the opposite facing surfaces of the first top part and the first bottom part are less than 2 mm from a respective main surface of a substrate accommodated between them. In the substrate loading/unloading-position the distance between the opposite facing surfaces is larger than in the process position. Both the first bottom part and the first top part each comprise a plurality of gas supply openings for supplying gas in two gaps between on the one hand the two opposite main surfaces of the substrate accommodated in the first single substrate process chamber and on the other hand the opposite facing surfaces of the first top and bottom parts so as to form gas bearings on both sides of the substrate for floatingly supporting the substrate within the process chamber.

The second single substrate process chamber is bounded by a second bottom part and a second top part for accommodating a substantially flat substrate between them. Upon placement of the substrate between the second bottom part and the second top part, opposite facing surfaces of the second bottom part and the second top part are parallel to each other and to two opposite main surfaces of the substrate. The second bottom part and the second top part are moveable away from and towards each other between a process position and a substrate loading/unloading-position. In the process position the opposite facing surfaces of the second top part and the second bottom part are less than 2 mm from a respective main surface of a substrate accommodated between them. In the substrate loading/unloading-position the distance between the opposite facing surfaces is larger than in the process position. Both the second bottom part and the second top part each comprise a plurality of gas supply openings for supplying gas in two gaps between on the one hand the two opposite main surfaces of the substrate accommodated in the second single substrate process chamber and on the other hand the opposite facing surfaces of the second top and bottom parts so as to form gas bearings on both sides of the substrate for floatingly supporting the substrate within the process chamber.

The invention also provides a method according to claim 17. In particular the invention provides a method for applying an ALD-film on a substrate by means of atomic layer deposition. The method comprises providing an atomic layer deposition apparatus according to the invention, processing a substrate in subsequent and alternating first and second process steps in respectively the first and the second single substrate process chambers and transferring the substrate between the first and the second single substrate process chambers between the first and second subsequent and alternating process steps.

With the atomic layer deposition apparatus and the method according to the invention, the first and second process steps of the atomic layer deposition process can be performed in different single substrate process chambers. E.g. the first process step can be performed in the first single substrate process chamber, and the second process step can be performed in the second single substrate process chamber. This means that the temperatures within each single substrate process chamber can be precisely attuned or optimized to a precursor to be deposited. For example, the temperature in the first substrate process chamber may be set at a first temperature, which is optimized for a first precursor. The temperature in the second substrate process chamber may be set at a second temperature, which is optimized for a second precursor. Between the first and the second process steps, the substrate, which will be at the first temperature, can be transferred to the second process chamber. In said process chamber the substrate will very quickly assume the second temperature. The change of temperature of the substrate can be very quick because the substrate may be very thin relative to the top and bottom parts bounding the second process chamber, which means the substrate will have a much smaller heat capacity of than said parts. Furthermore, because of the proximity of the substrate to the top and bottom parts, which is less than 2 mm from either, the heat transfer from the top and bottom parts to the substrate, or vice versa, depending on the temperature gradient, will be effected by means of conductance, which is a very effective way to transfer heat. Of course, the same applies when the substrate is transferred from the second process chamber to the first process chamber. Then also the substrate will very quickly assume the temperature of the first process chamber, for the same reasons as mentioned above.

The total time it takes to transfer the substrate from the first to the second single substrate process chamber and to warm up or cool down the substrate in the second process chamber, is much less than the time it takes to change the temperature in the process chamber of the prior art ALD-apparatus.

The present invention will be further elucidated with reference to figures of an example in which various embodiments of the invention are incorporated. The embodiments may be combined or may be applied separately from each other.

DETAILED DESCRIPTION OF THE FIGURES

In this application similar or corresponding features are denoted by similar or corresponding reference signs. The description of the various embodiments is not limited to the examples shown in the figures and the reference numbers used in the detailed description and the claims are not intended to limit the description of the embodiments, but are included to elucidate the embodiments by referring to the example shown in the figures.

In the most general terms, the invention relates to an atomic layer deposition apparatus 10 comprising first single substrate process chamber 12, a second single substrate process chamber 14, and a transfer mechanism 36 configured to transfer the substrate 24 between the first and the second process chambers 12, 14.

The first single substrate process chamber 12 is bounded by a first bottom part 16 and a first top part 20 for accommodating a substantially flat substrate 24 between them. Upon placement of the substrate 24 between the first bottom part 16 and the first top part 20, opposite facing surfaces 16a, 20a of the first bottom part 16 and the first top part 20 are parallel to each other and to two opposite main surfaces 24a, 24b of the substrate 24. The first bottom part 16 and the first top part 20 are moveable away from and towards each other between a process position and a substrate loading/unloading-position. In the process position, of which examples are shown in FIGS. 1, 2, 4, 5, and 6 the opposite facing surfaces 20a, 16a of the first top part 20 and the first bottom part 16 are less than 2 mm from a respective main surface 24a, 24b of a substrate 24 accommodated between them In the substrate loading/unloading-position, of which an example is shown in FIG. 3, the distance between the opposite facing surfaces 16a, is larger than in the process position. Both the first bottom part 16 and the first top part 20 each comprise a plurality of gas supply openings 26 for supplying gas in two gaps between on the one hand the two opposite main surfaces 24a, 24b of the substrate 24 accommodated in the first single substrate process chamber 12 and on the other hand the opposite facing surfaces 20a, 16a of the first top and bottom parts 20, 16 so as to form gas bearings on both sides of the substrate 24 for floatingly supporting the substrate 24 within the process chamber 12.

The second single substrate process chamber 14 is bounded by a second bottom part 18 and a second top part 22 for accommodating a substantially flat substrate 24 between them. Upon placement of the substrate 24 between the second bottom part 18 and the second top part 22, opposite facing surfaces 18a, 22a of the second bottom part 18 and the second top part 22 are parallel to each other and to two opposite main surfaces 24a, 24b of the substrate 24. The second bottom part 18 and the second top part 22 are moveable away from and towards each other between a process position and a substrate loading/unloading-position. In the process position, of which examples are shown in FIGS. 1, 2, 4, 5, and 6, the opposite facing surfaces 22a, 18a of the second top part 22 and the second bottom part 18 are less than 2 mm from a respective main surface 24a, 24b of a substrate 24 accommodated between them. In the substrate loading/unloading-position, of which an example is shown in FIG. 3, the distance between the opposite facing surfaces 18a, 22a is larger than in the process position. Both the second bottom part 18 and the second top part 22 each comprise a plurality of gas supply openings 26 for supplying gas in two gaps between on the one hand the two opposite main surfaces 24a, 24b of the substrate 24 accommodated in the second single substrate process chamber 14 and on the other hand the opposite facing surfaces 22a, 18a of the second top and bottom parts 22, 18 so as to form gas bearings on both sides of the substrate 24 for floatingly supporting the substrate 24 within the process chamber 14.

The effects and advantages of the atomic layer deposition apparatus 10 have been described in the summary section and these effects and advantages are inserted here by reference.

In an embodiment, at least one of the first top part 20 and the first bottom part 16 comprises a first controllable heater to control the temperature thereof, and at least one of the second top part 22 and the second bottom part 18 comprises a second controllable heater to control the temperature thereof.

Both controllable heaters may be used to control the temperature of the substrate 24 in their respective process chambers 12, 14. The first controllable heater may e.g. be used to keep the temperature of the substrate 24 in the first single substrate process chamber 12 at a first temperature $T_1$, while the second controllable heater is used to keep the temperature of the substrate 24 in the second single substrate process chamber 14 at a second temperature $T_2$. Both temperatures $T_1$, $T_2$ may be the same, or they may be different. The first controllable heater may also comprise a first heating part connected to, or part of, the first top part 20, and a second heating part connected to, or part of, the first bottom part 16. Both heating parts of the first controllable heater may co-operate to control the temperature of the first process chamber 12, and/or a substrate in the first process chamber 12. This may be done e.g. by having the temperature of both heating parts the same, or at different temperature values. The temperature of the first heating part may e.g. be above an optimal temperature range of a to be applied precursor, while the temperature of the second heating part is below the optimal temperature range. The difference may be such that the temperature of the substrate 24 in the first process chamber 12 is within the optimal temperature range. This will optimize the deposition rate on the substrate, while minimizing the deposition on the top and bottom parts 20, 16 of the first process chamber 12. Of course, when the temperature of the first heating part is below the optimal temperature range, while the temperature of the second heating part is above the optimal temperature range, similar effects and advantage apply. The second controllable heater may comprise a first heating part and a second heating part similar to the first controllable heater.

In an embodiment, of which examples are shown in FIGS. 2-5, the atomic layer deposition apparatus 10 further comprises a sealing ring 42 for each process chamber 12, 14. At least during processing of a substrate 24 in a respective one of the single substrate process chambers 12, 14, the sealing ring 42 is arranged between the top and bottom part 16, 18, 20, 22 of the respective single substrate process chamber 12, 14 and is configured to seal off the process chamber 12, 14 when the bottom and top part 16, 18, 20, 22 of the respective single substrate process chamber 12, 14 are in the process position.

The sealing ring 42 may have an inner boundary wall 46 which bounds a ring opening 48 of which the dimensions suffice to accommodate a substrate 24 therein.

With such a sealing ring, the first and second process chambers 12, 14 may be hermetically closed off. The bottom part 16, 18, top part 20, 22, and sealing ring 42 form an enclosure, allowing the chambers 12, 14 to have a mini-environment within their boundaries. In such a mini-environment, all, or most of the impurities occurring within natural air can be eliminated, or filtered out.

Figure 4:
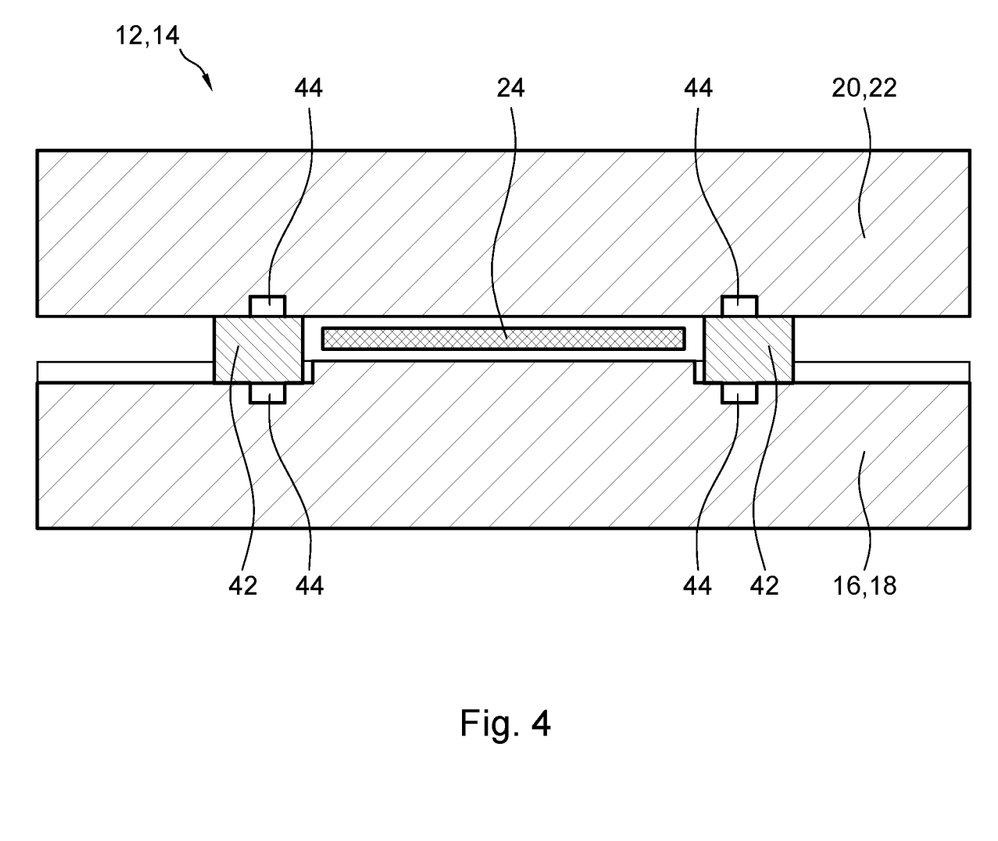
FIG. 4 another example of a single substrate process chamber provided with a sealing ring in which a substrate is accommodated.

Adjacent the sealing ring 42 the top part 20, 22 or bottom part 16, 18 of the respective single substrate process chamber 12, 14 may comprise a groove 44, of which an example is shown in FIG. 4. The groove 44 may form an annular chamber bounded by the sealing ring 42 and the respective adjacent top part 20, 22 or bottom part 16, 18 of said respective single substrate process chamber 12, 14. The respective adjacent top part 20, 22 or bottom part 16, 18 may further comprise a purge gas inlet connected to a purge gas source and configured to supply a purge gas to the annular chamber so as to form, in operation, a purge seal between the sealing ring 42 and the respective adjacent top part 20, 22 or bottom part 16, 18.

The purge seal may be used to further seal of the respective first or second process chamber 12, 14 from the environment outside said chamber 12, 14. The purge gas may be any kind of inert gas, e.g. nitrogen $N_2$. The groove 44 allowing the purge seal to be formed in either the top part 20, 22 or the bottom part 16, 18, may also be situated on both the top and bottom parts 20, 22, 16, 18. In the latter situation both the connection between the sealing ring 42 and top part 20, 22, as well as the connection between the sealing ring 42 and the bottom part 16, 18 are sealed off. Instead of the shown gas seal in FIG. 4, other known gas seals may be applied also.

Figure 5:
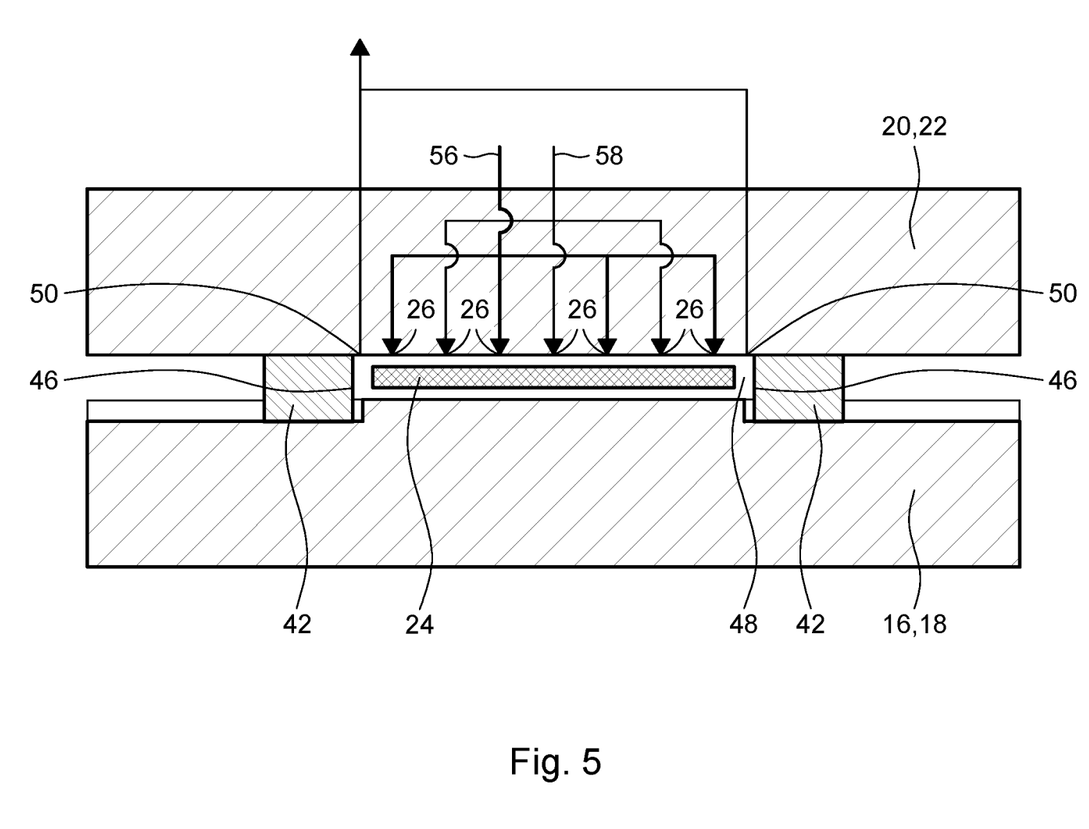
FIG. 5 shows an example of a single substrate process chamber provided with two gas inlets and a gas exhaust opening.

In an embodiment, of which an example is shown in FIG. 5, at least one gas exhaust opening 50 is provided in both the first single substrate process chamber 12 and the second single substrate process chamber 14.

FIG. 5 shows an example in which two gas exhaust openings 50 are visible. Through these gas exhaust openings 50 gas may be exhausted from the respective process chamber 12, 14, such as residue or left over precursor gas, or purge gas.

As shown in the example of FIG. 5, the at least one gas exhaust opening 50 may emanate in the process chamber 12, 14 at a position in the process chamber 12, 14 which is adjacent the inner boundary wall 46 of a sealing ring 42. This may be the above described sealing ring 42. The at least one gas exhaust opening 50 may, in use, also emanate outside of an outer circumferential edge 24c of a substrate 24 accommodated in the respective single substrate process chamber 12, 14.

In this way the gas exhaust opening 50 does not interfere with the gas supply opening forming the gas bearings for floatingly supporting the substrate 24. The gas supplied via the gas inlet openings flows laterally/radially towards the outer circumference of the substrate 24 to be exhausted via the gas exhaust openings 50.

In an embodiment the transfer mechanism 36 comprises a handler 52 including pins 54 configured to support the substrate 24. Instead of pins 54, also a ring may be used.

When the respective process chamber 12, 14 is in the loading/unloading-position, the top parts 20, 22, and bottom part 16, 18 are further away than in the process position, which means that there are no gas bearings to support the substrate 24. In the absence of the gas bearings, the pins may support the substrate. The handler 52 with the pins can also transport the substrate 24 from the first process chamber to the second process chamber and vice versa.

Figure 2:
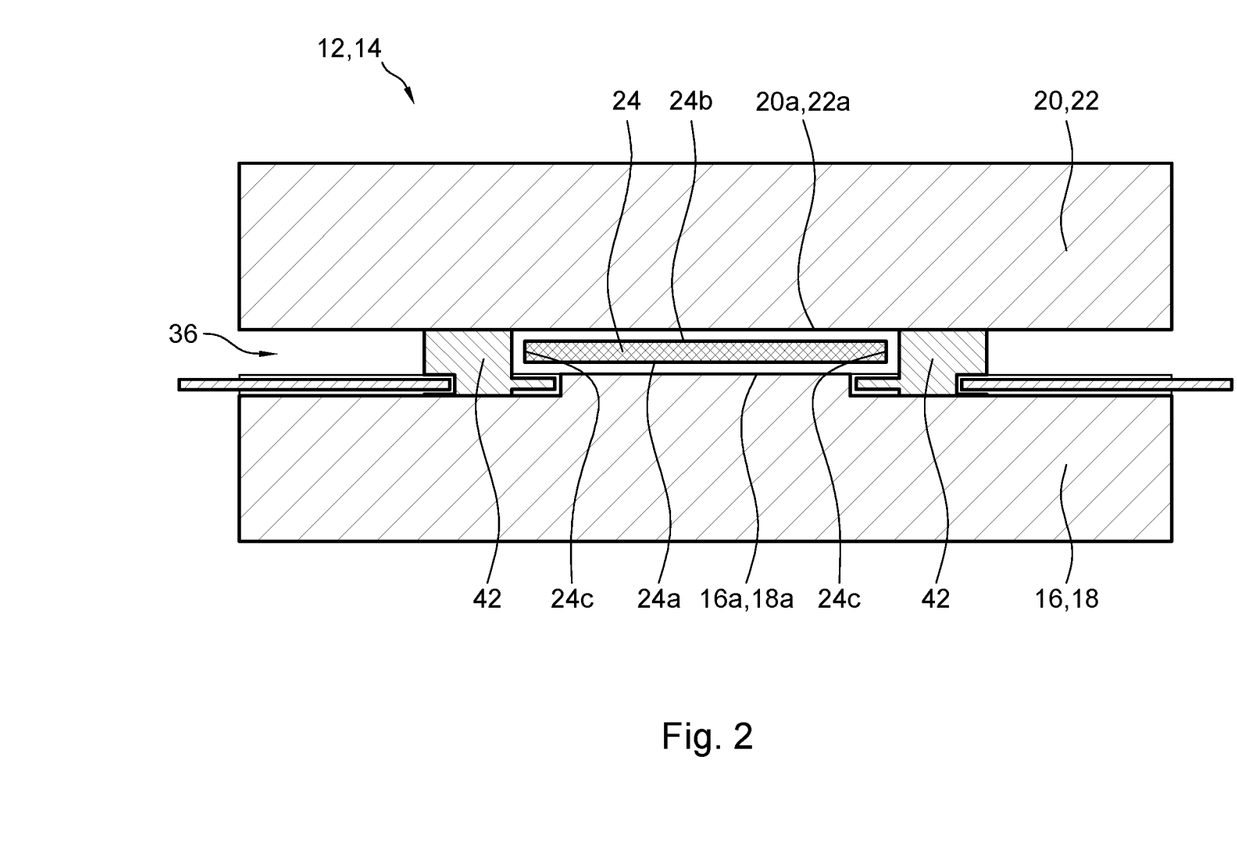
FIG. 2 shows an example of a single substrate process chamber provided with a sealing ring in which a substrate is accommodated, wherein the top and bottom parts are in the process position.
Figure 3:
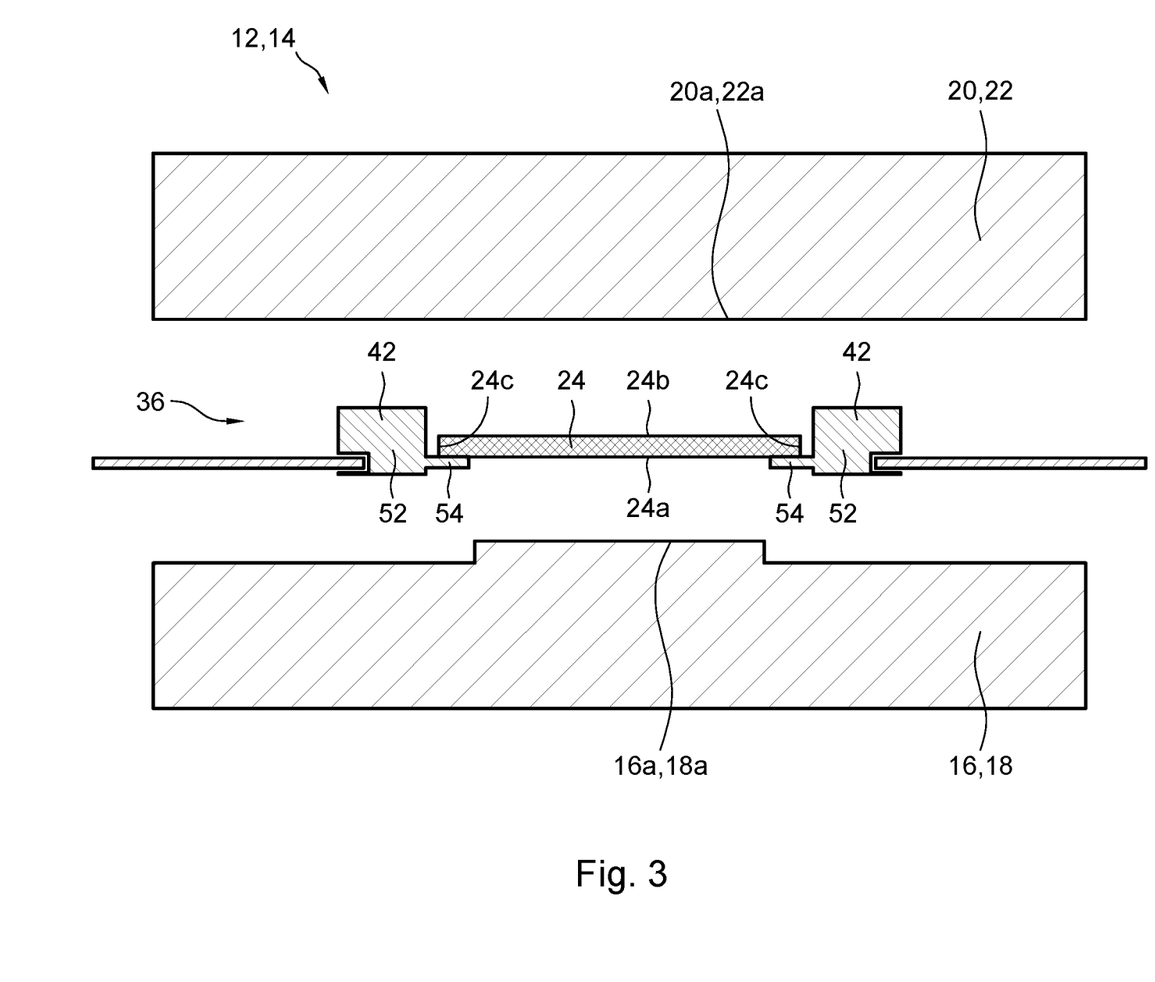
FIG. 3 shows the example of FIG. 2 with the top and bottom parts in the loading/unloading-position.

In an embodiment, as shown in FIGS. 2 and 3, the transfer mechanism 36 comprises a sealing ring 42, wherein the sealing ring 42 is provided with pins 54 configured to support the substrate 24. During transfer, both the sealing ring 42 as well as the substrate 24 supported by the sealing ring 42 are transferred between the first 12 and the second process chamber 14. The sealing ring 42 may be the same sealing ring 42 as described above.

The sealing ring 42 provided with the pins 54, may be an embodiment of the handler 52 described above. As said with the previous embodiment, when the respective process chamber 12, 14 is in the loading/unloading-position, the top part 20, 22, and bottom part 16, 18 are further away than in the process position, which means that there are no gas bearings to support the substrate 24. In the absence of the gas bearings, the pins may support the substrate. The sealing ring 42 with the pins can also transport the substrate 24 from the first process chamber to the second process chamber and vice versa.

FIG. 2 shows the top part 20, 22 and bottom part 16, 18 in the process position, in which the parts 20, 22, 16, 18 are near the substrate 24 accommodated in the process chamber 12, 14, and said substrate 24 is floatingly supported by the gas bearings formed by the gas supplied by the gas supply openings 26. FIG. 3 shows the top part 20, 22 and bottom part 16, 18 in the loading/unloading-position, in which the parts 20, 22, 16, 18 are further away from each other than in the process position, in which position the substrate 24 is supported by the pins 54 on the sealing ring 42.

When the substrate is supported by the pins 54 of the sealing ring 42, the substrate 24 may be moved together with the sealing ring 42. E.g. when both the bottom and top parts 16, 20 of the first single substrate process chamber 12 and the bottom and top parts 18, 22 of the second single substrate process chamber 14 are in the loading/unloading-position, the sealing ring 42 with substrate 24 may be moved from the position of the first process chamber 12 to the position of the second process chamber 14, or vice versa. By moving the sealing ring 42 together with the substrate 24, the handling of the substrate 24 is very convenient and efficient.

When the top part 20, 22 and bottom part 16, 18 between which the sealing ring 42 is arranged are in the process position, the pins 54 of the sealing ring 42 may be recessed in a groove in the bottom part 16, 18. In this way, the pins do not have to be retracted, which means there are less moving parts, making the design more robust and less expensive.

In an embodiment, of which an example is shown in FIG. 5, the first bottom and top parts 16, 20 as well as the second bottom and top parts 18, 22 each comprise at least one gas inlet 56, 58 which is in fluid communication with at least a subset or, alternatively all of the plurality of gas supply openings 26 of the respective part 16, 18, 20, 22.

At least one of the first bottom and top parts 16, 20 as well as at least one of the second bottom and top parts 18, 22 may comprise two gas inlets 56, 58. A first one 56 of the two gas inlets may be in fluid connection with a first subset of the plurality of gas supply openings 26 and a second one 58 of the two gas inlets may be in fluid connection with a second subset of the plurality of gas supply openings 26. The gas supply openings 26 of the first subset may be not part of the second subset and the gas supply openings 26 of the second subset may be not part of the first subset.

Figure 1:
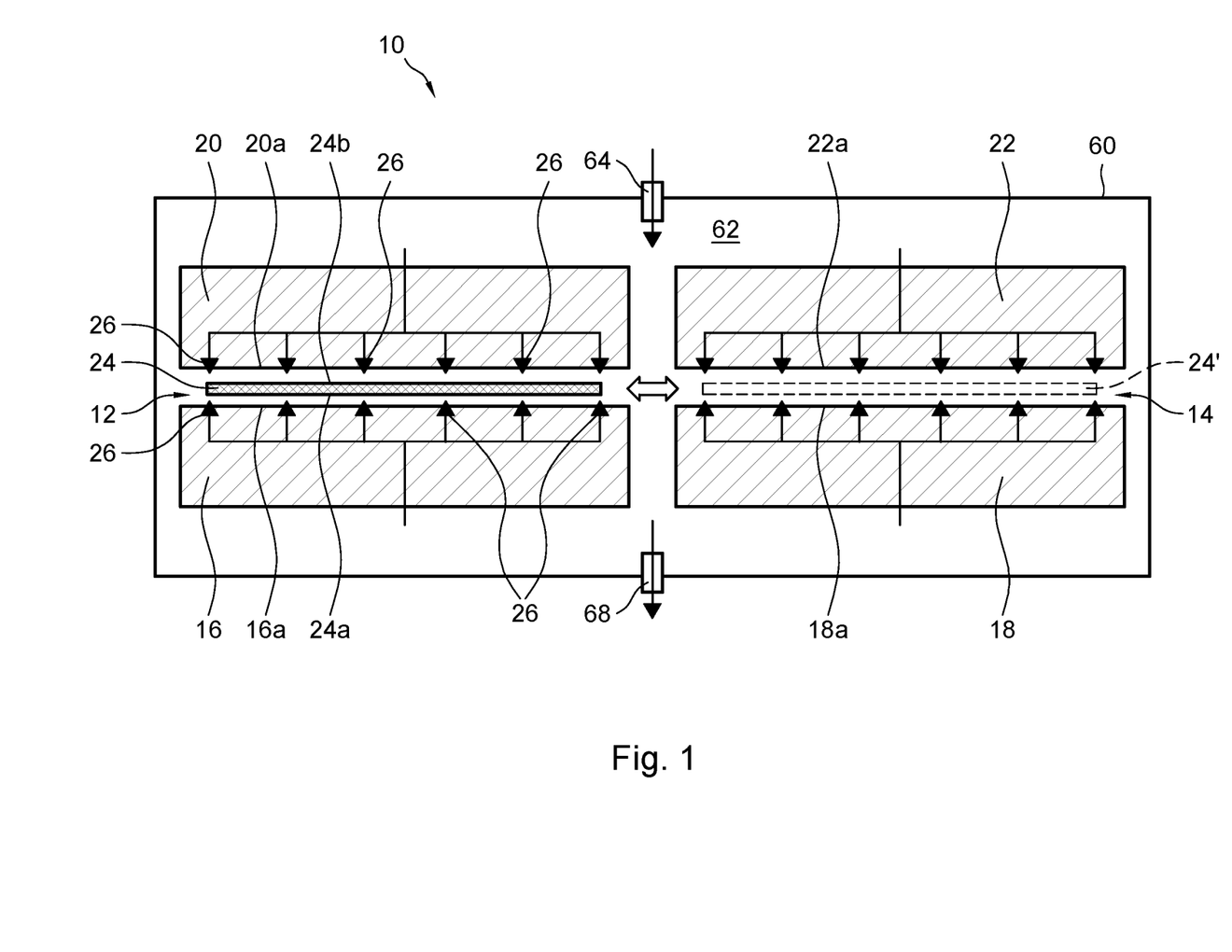
FIG. 1 shows an example of the atomic layer deposition apparatus.

In an embodiment, of which an example is shown in FIG. 1, the atomic layer deposition apparatus 10 further comprises a housing 60 bounding a housing chamber 62 in which the first and the second process chambers 12, 14 and the transfer mechanism 36 are accommodated. The housing 60 comprises a protective gas inlet 64, and a protective gas outlet 68. The protective gas inlet 64 is connected to a protective gas source for supplying protective gas into housing chamber 62. The protective gas outlet 68 is connected to an exhaust for exhausting protective gas from the housing chamber 62.

Within the housing chamber 62 a protective, or mini-environment may be formed. The protective gas inlet 64 may supply e.g. a purge gas, such as nitrogen $N_2$. The effect is that most impurities and/or reactant gasses, such as oxygen $O_2$ will be eliminated from within the housing chamber 62, so that they cannot contaminate the ALD-process.

Figure 6:
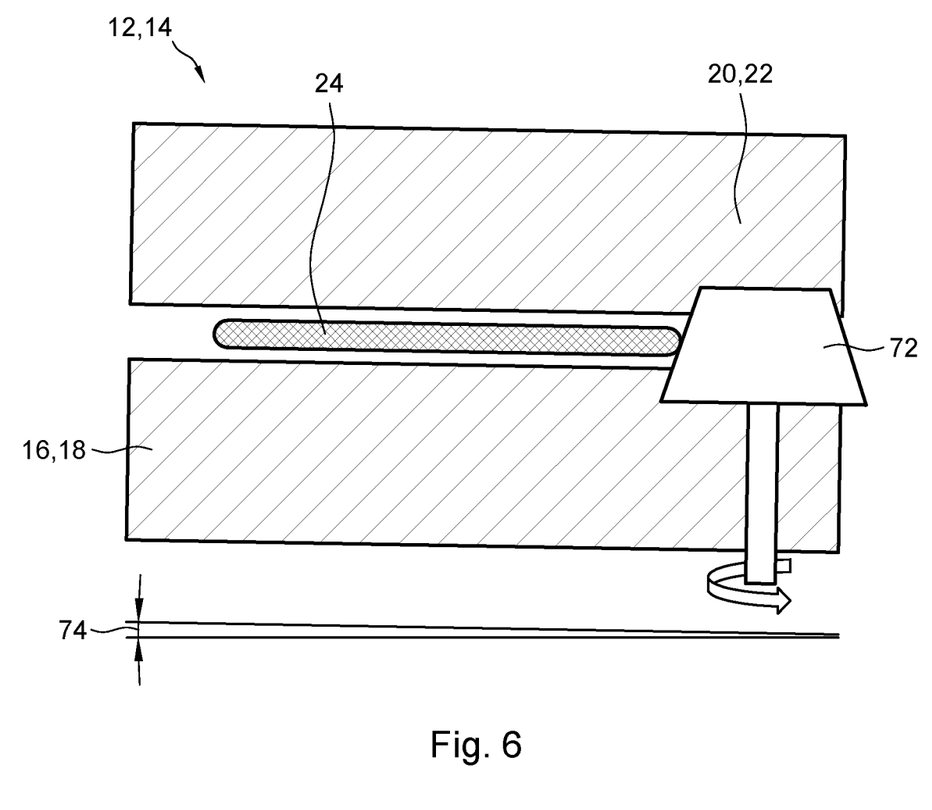
FIG. 6 shows a single substrate process chamber provided with a capstan.

In an embodiment, of which an example is shown in FIG. 6, the first and/or second process chamber 12, 14 further comprises at least one conically shaped rotatable capstan 72. The capstan 72 is configured to engage the outer edge 24c of the substrate 24 and to rotate the substrate 24 in the respective process chamber 12, 24.

In order for the capstan 72 to engage the substrate 24, said substrate 24 should be pushed, urged, or otherwise driven in the general direction of the capstan 72. This may, for example, be effected by tilting the opposite facing surfaces 16a, 20a of the first bottom and top parts 16, 20 as well as the opposite facing surfaces 18a, 22a of the second bottom and top parts 18, 22 over a tilt angle 74 with respect to the horizontal so that gravity forces urge a substrate 24 against the at least one capstan 72. The tilt angle 74 may be less than 5°, preferably substantially 1°.

Another example may be that at least one of the plurality of the gas supply openings 26 of the first and the second single substrate process chambers 12, 14 is configured to supply to the respective process chamber 12, 14 a corresponding at least one gas flow which has a directional component in the direction of the capstan 72 so that a drag force of said at least one gas flow exerted on the substrate 24 urges the substrate 24 against the capstan 72. This example may be used instead of, or together with the tilt angle 74 in order to urge the substrate 24 against the capstan 72.

The invention also relates to a method for applying an ALD-film on a substrate 24 by means of atomic layer deposition. The method comprises providing an atomic layer deposition apparatus 10 according to the invention, and processing a substrate 24 in subsequent and alternating first and second process steps in respectively the first and the second single substrate process chambers 12, 14 and transferring the substrate 24 between the first and the second single substrate process chambers 12, 14 between the first and second subsequent and alternating process steps.

The effects and advantages of the method have been described in the summary section and these effects and advantages are inserted here by reference.

In an embodiment the first process steps within the first single substrate process chamber 12 are performed at a first temperature $T_1$, and the second process steps within the second single substrate process chamber 14 are performed at a second temperature $T_2$. The first temperature $T_1$ may differ from the second temperature $T_2$. The first temperature $T_1$ may also be the same as the second temperature $T_2$. A first precursor gas supplied in the first single substrate process chamber 12 may be different from a second precursor gas supplied in the second single substrate process chamber 14.

In an example, the atomic layer deposition is of the two-temperature AB-type in that a first precursor A is supplied in the first single substrate process chamber 12 and a second precursor B is supplied in the second single substrate process chamber 14. The first temperature $T_1$ differs from the second temperature $T_2$.

This example is well suited to deposit a film of gallium nitride (GaN). The first precursor A is trimethylgallium (TMG) and is supplied in the first single substrate process chamber 12 at the first temperature T 1 of 330-350° C. The substrate temperature in this window is above the trimethylgallium (TMG) condensation temperature and below the trimethylgallium (TMG) thermal decomposition temperature. During the trimethylgallium (TMG) pulse a monolayer of trimethylgallium (TMG) is adsorbed on the substrate surface in a self-saturating manner without condensing or decomposing. The second precursor B is ammonia (NH 3) and is supplied in the second single substrate process chamber 14 at the second temperature $T_2$ of 400-420° C. The substrate temperature in this window is high enough to promote the chemical reaction between the ammonia ($NH_3$) and the trimethylgallium (TMG) monolayer on the substrate surface to form the film of gallium nitride (GaN).

In another example, the atomic layer deposition is of the two-temperature ABC-type including repeatedly performing the following subsequent steps:
 exposing a substrate 24 to a precursor A, e.g. an inhibitor, which is supplied in the first single substrate process chamber 12 maintained at the first temperature $T_1$, and
 exposing the substrate 24 to second precursor B and subsequently to a third precursor C which are subsequently supplied in the second single substrate process chamber 14 maintained at the second process temperature $T_2$.

This example is well suited for selective-area deposition of hafnium nitride ($Hf_3N_4$) films. The substrate 24 is exposed to the first precursor A, which is the inhibitor, e.g. a vapor of undecanethiol (C11H23SH). The inhibitor is supplied in the first single substrate process chamber 12 maintained at the first temperature $T_1$ of 120-160° C. The substrate temperature in this window results in a self-limited growth of a film with a 2.5 nm thickness. This film locally passivates a patterned surface, e.g. surface of metallic copper (Cu), and serves as a masking layer so that ALD films are only added where needed.

The substrate 24 is exposed to the second precursor B which is tetrakis(dimethylamido)hafnium (TDMAHf), and subsequently to the third precursor C which is ammonia ($NH_3$), which are subsequently supplied in the second single substrate process chamber 14 maintained at the second process temperature $T_2$ of 160-180° C. in order to deposit a hafnium nitride ($Hf_3N_4$) monolayer. This hafnium nitride ($Hf_3N_4$) ALD cycle is repeated 40-times to deposit the hafnium nitride ($Hf_3N_4$) film having a thickness of 6-nm on a dielectric surface, e.g. surface of silicon dioxide ($SiO_2$), while a metallic surface is protected by the masking layer.

In yet another example, the atomic layer deposition is of the two-temperature ABC-type including repeatedly performing the following subsequent steps:
 exposing a substrate 24 to a first precursor A, and subsequently to a second precursor B which are subsequently supplied in the first process single substrate process chamber 12 maintained at the first process temperature $T_1$; and
 exposing the substrate 24 to a third precursor C which is supplied in the second single substrate process chamber 14 maintained at the second process temperature $T_2$.

This example is well suited for thermal ALD of noble metals, e.g. ruthenium (Ru). The substrate 24 is exposed to the first precursor A which is bis(ethylcyclopentadienyl) ruthenium ($Ru(EtCp)_2$), and subsequently to the second precursor B which is oxygen ($O_2$) which are subsequently supplied in the first process single substrate process chamber 12 maintained at the first process temperature $T_1$ in the range of 150-300° C. Deposition of a ruthenium (Ru) monolayer occurs through dissociative chemisorption of the $Ru(EtCp)_2$ and further combustion in the subsequent oxygen ($O_2$) exposure step. A next ruthenium (Ru) monolayer cannot be deposited because ruthenium oxide ($RuO_2$) formed on the surface of the ruthenium (Ru) monolayer prevents dissociative chemisorption of $Ru(EtCp)_2$ and $Ru(EtCp)_2$ adsorbs molecularly on the ruthenium oxide ($RuO_2$). The ruthenium oxide ($RuO_2$) must be removed from the ruthenium (Ru) surface. The substrate 24 is exposed to the third precursor C which is hydrogen ($H_2$) and which is supplied in the second single substrate process chamber 14 maintained at the second process temperature $T_2$ in the range of 150-250° C. The hydrogen ($H_2$) serves to reduce the ruthenium oxide ($RuO_2$) on the surface of the ruthenium (Ru) layer the $Ru(EtCp)_2$ to dissociative chemisorb on the ruthenium (Ru) metal surface in the subsequent deposition cycle in the first chamber 12. The first process temperature $T_1$ in the first chamber 12 is preferably tuned so as to achieve a high combustion rate (which determines the film growth per cycle rate) and simultaneously to avoid forming ruthenium oxide ($RuO_2$) or etching of the ruthenium (Ru) through formation of the volatile ruthenium(VIII) oxide ($RuO_4$). The second process temperature $T_2$ in the second chamber 14 is preferably tuned so as to reduce the ruthenium oxide ($RuO_2$) on the surface of the ruthenium (Ru) metal.

In again another example, the atomic layer deposition is a two-temperature supercycle ALD including repeatedly performing the following subsequent steps:
 exposing a substrate 24 to several cycles of selective AB or ABC-type ALD in the first single substrate process chamber 12 maintained at the first temperature $T_1$, wherein on the substrate 24 a growth area is formed and a non-growth area; and
 removing unwanted deposition from the non-growth area in the second single substrate process chamber 14 maintained at the second temperature $T_2$ by exposing the non-growth area to an etching gas.

This example is well suited to deposit a film of tungsten or tungsten (W) selectively on silicon (Si) in respect to silicon dioxide ($SiO_2$). The substrate 24 is exposed to several tungsten (W) ALD cycles in the first single substrate process chamber 12 maintained at the first temperature $T_1$ of 220° C., wherein on the substrate 24 a growth area (Si) and a non-growth area ($SiO_2$) are formed. Tungsten (W) deposition is achieved by alternately supplying a first precursor silane ($SiH_4$) and a second precursor tungsten fluoride ($WF_6$) with inert gas purge steps following each precursor. After several ALD cycles Si—H sites appear on the silicon dioxide ($SiO_2$) non-growth area producing sites for subsequent tungsten fluoride ($WF_6$) reaction. These Si—H sites must be passivated in order to maintain the ALD selectivity.

In order to passivate unwanted Si—H sites and to remove deposited material on the silicon dioxide ($SiO_2$) non-growth area, the substrate 24 is exposed to an etching gas vapor hydrogen fluoride (HF) in the second single substrate process chamber 14 maintained at the second temperature $T_2$. The temperature $T_2$ is preferably tuned to remove the deposited material from the non-growth area while the etching of material on the growth area should be much lower than the amount of material that is deposited.

Figure 7:
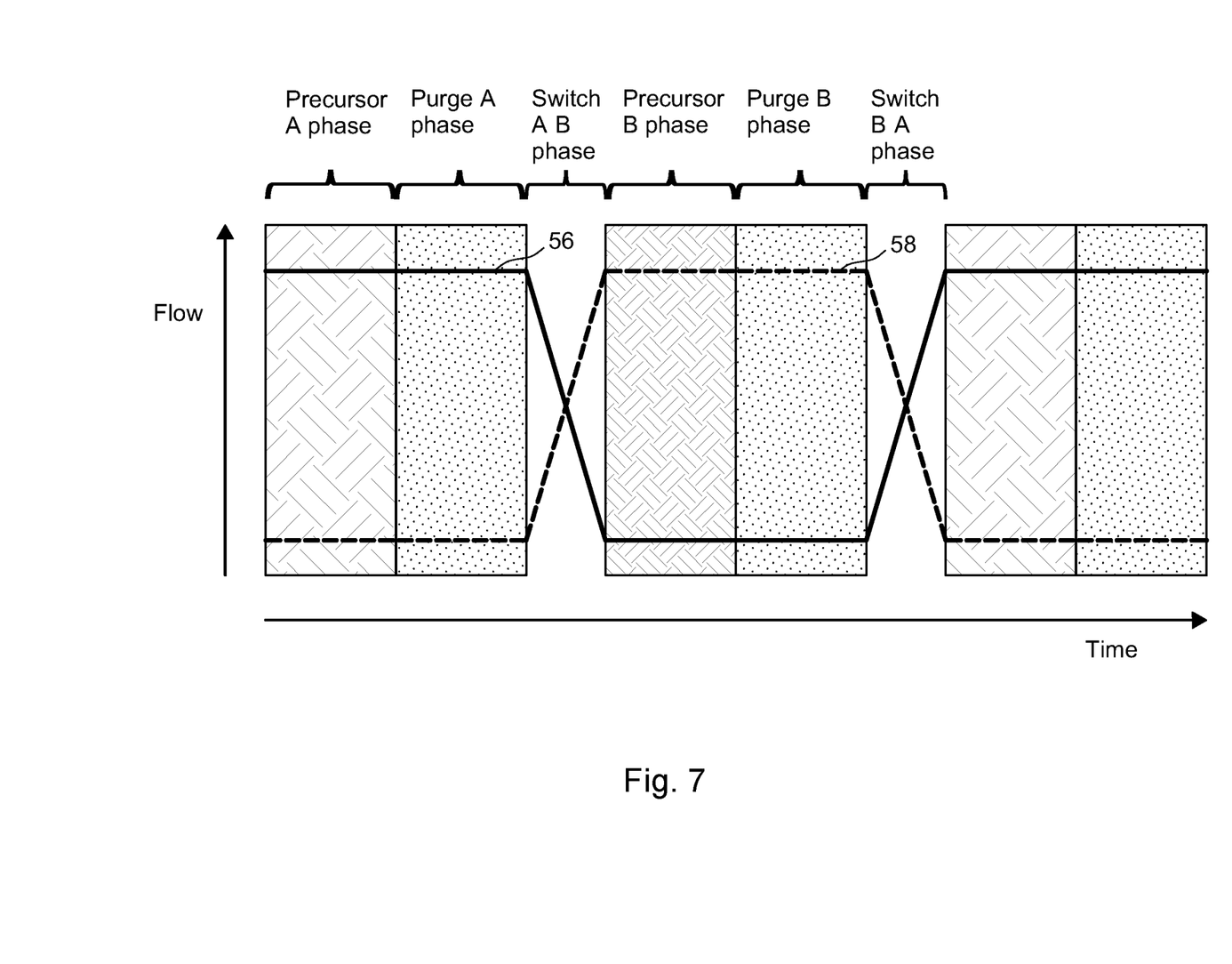
FIG. 7 shows an example of a control gas flow scheme.

In an embodiment of the method, of which a graphic representation is shown in FIG. 7, at least in one of the first and the second single substrate process chamber 12, 14 a first precursor gas A and a second precursor gas B are subsequently supplied via the gas supply openings 26 to perform subsequent ALD-cycles. The subsequent ALD-cycles are separated by a supply of purge gas via the same gas supply openings 26. The sum of the flows of the purge gas, the first precursor gas A and the second precursor gas B is kept constant during the subsequent ALD-cycles within each process step in said respective single substrate process chamber 12, 14.

As already explained with reference to FIG. 5, the atomic layer deposition apparatus has at least a first gas inlet 56, and a second gas inlet 58. The first gas inlet 56 is configured to supply the first precursor gas A and/or a purge gas. The second gas inlet 58 is configured to supply the second precursor gas B and/or a purge gas. FIG. 7 shows an example of supplying the gases in various phases which are repeated with each ALD-cycle. In the precursor A phase, precursor A, and optionally a purge gas is supplied via the first gas inlet 56. In the Purge A phase only the purge gas is supplied via the first gas inlet 56. In the Switch A-B phase both the first gas inlet 56, and the second gas inlet 58 supply the purge gas, wherein the supply via the first gas inlet 56 is diminished over time and the supply via the second gas inlet 58 is increased over time such that the total flow is kept constant. In the precursor B phase, precursor B, and optionally the purge gas is supplied via the second gas inlet 58. In the Purge B phase only the purge gas is supplied via the second gas inlet 58. In the Switch B-A phase both the first gas inlet 56, and the second gas inlet 58 supply the purge gas, wherein the supply via the second gas inlet 58 is diminished over time and the supply via the first gas inlet 56 is increased over time such that the total flow is kept constant.

In addition to the mentioned phases, other phases, possible including more precursors are possible, as long as the sum of the flows of the purge gas, and the precursor gasses is kept constant during the subsequent ALD-cycles within each process step in said respective single substrate process chamber 12, 14.

To obtain a constant flow of gas out of the gas supply openings 26 in order to be able to form the gas bearings, it is known to continuously supply gas out of all said openings 26. This would mean that a first subset of the gas supply openings 26, e.g. in communication with the first gas inlet 56, would supply the precursor A gas, while simultaneously a second subset of the gas supply openings 26, e.g. in communication with the second gas inlet 58, would supply a purge gas. In another step, the second subset would supply the second precursor B, while the first subset would supply the purge gas. This has the disadvantage that the supply of precursor by one subset is always diluted by the supply of purge gas from the other subset. Furthermore, the deposition of precursor A on the substrate 24 under the gas supply openings 26 of the second subset in communication with the second gas inlet 58 would be prevented, or at least impeded by the flow of purge gas from said gas supply openings 26. These problems are prevented by supplying the precursor gasses and purge gas as described above, while still the flow of all gasses is suitable to form gas bearings to support the substrate 24.

The various embodiments which are described above may be implemented independently from one another and may be combined with one another in various ways. The reference numbers used in the detailed description and the claims do not limit the description of the embodiments nor do they limit the claims. The reference numbers are solely used to clarify by referring to the non-limiting example in the figures.

LEGEND

- 10—atomic layer deposition apparatus
- 12—first single substrate process chamber
- 14—second single substrate process chamber
- 16—first bottom part
- 16a—surface of first bottom part
- 18—second bottom part
- 18a—surface of second bottom part
- 20—first top part
- 20a—surface of first top part
- 22—second top part
- 22a—surface of second top part
- 24—substrate
- 24a—main surface of substrate
- 24b—main surface of substrate
- 24c—outer circumferential edge of substrate
- 26—gas supply opening
- 36—transfer mechanism
- 42—sealing ring
- 44—groove
- 46—inner boundary wall (of sealing ring)
- 48—ring opening
- 50—gas exhaust opening
- 52—handler
- 54—pin
- 56—first gas inlet
- 58—second gas inlet
- 60—housing
- 62—housing chamber
- 64—protective gas inlet
- 68—protective gas outlet
- 72—capstan
- 74—tilt angle
- $T_1$—first temperature
- $T_2$—second temperature

The invention claimed is:

1. An atomic layer deposition apparatus comprising:

a first single substrate process chamber bounded by a first top part and a first bottom part for accommodating a substantially flat substrate between the first top part and the first bottom part,
  wherein opposite facing surfaces of the first top part and the first bottom part are parallel to each other and to respective, top and bottom main surfaces of the substrate, upon placement of the substrate between the first top part and the first bottom part,
  wherein the first top part and the first bottom part are moveable away from and towards each other, between a process position in which the opposite facing surfaces of the first top part and the first bottom part are less than 2 mm from the respective, top and bottom main surfaces of the substrate accommodated between the first top part and the first bottom part, and a substrate loading/unloading-position in which the opposite facing surfaces of the first top part and the first bottom part are greater than 2 mm from the respective, top and bottom main surfaces of the substrate,
  wherein each of the first top part and the first bottom part comprises a plurality of gas supply openings for supplying gas between (i) the top main surface of the substrate accommodated in the first single substrate process chamber and the surface of the first top part and (ii) the bottom main surface of the substrate accommodated in the first single substrate process chamber and the surface of the first bottom part so as to form gas bearings for floatingly supporting the substrate within the first single substrate process chamber;

a second single substrate process chamber bounded by a second top part and a second bottom part for accommodating the substantially flat substrate between the second top part and the second top bottom part,
  wherein opposite facing surfaces of the second top part and the second bottom part are parallel to each other and to the respective, top and bottom main surfaces of the substrate, upon placement of the substrate between the second top part and the second bottom part, wherein the second top part and the second bottom part are moveable away from and towards each other, between a process position in which the opposite facing surfaces of the second top part and the second bottom part are less than 2 mm from the respective, top and bottom main surfaces of the substrate accommodated between the second top part and the second bottom part, and a substrate loading/unloading-position in which the opposite facing surfaces of the second top part and the second bottom part are greater than 2 mm from the respective, top and bottom main surfaces of the substrate, wherein each of the second top part and the second bottom part comprises a plurality of gas supply openings for supplying gas between (i) the top main surface of the substrate accommodated in the second single substrate process chamber and the surface of the second top part and (ii) the bottom main surface of the substrate accommodated in the second single substrate process chamber and the surface of the second bottom part so as to form gas bearings for floatingly supporting the substrate within the second single substrate process chamber; and a transfer mechanism including a handler with at least one sealing ring with pins for supporting the substrate, the handler being configured to transfer the substrate, supported on the pins of the at least one sealing ring, between the first and the second single substrate process chambers.

2. The atomic layer deposition apparatus according to claim 1, wherein at least one of the first top part and the first bottom part comprises a first controllable heater to control a first process chamber temperature, and wherein at least one of the second top part and the second bottom part comprises a second controllable heater to control a second process chamber temperature.

3. The atomic layer deposition apparatus according to claim 1, wherein the at least one sealing ring is arranged between the top and bottom parts of each of the first and second single substrate process chambers and configured to seal off the respective single substrate process chamber when the top and bottom parts of the respective single substrate process chamber are in the process position.

4. The atomic layer deposition apparatus according to claim 1, wherein at least one of the top part and the bottom part of the respective single substrate process chamber comprises a groove which forms an annular chamber bounded by the at least one sealing ring and the at least one of the top part and the bottom part, when the top and bottoms parts of the respective single substrate process chamber are in the process position, wherein the at least one of the top part and the bottom part comprises a purge gas inlet connected to a purge gas source and configured to supply a purge gas to the annular chamber so as to form, in operation, a purge seal between the at least one sealing ring and the at least one of the top part and the bottom part.

5. The atomic layer deposition apparatus according to claim 1, wherein the at least one sealing ring has an inner boundary wall bounding a ring opening of the at least one sealing ring and having dimensions sufficient to accommodate the substrate therein.

6. The atomic layer deposition apparatus according to claim 1, wherein at least one gas exhaust opening is provided in each of the first single substrate process chamber and the second single substrate process chamber.

7. The atomic layer deposition apparatus according to claim 6, wherein the at least one gas exhaust opening is positioned adjacent an inner boundary wall of the at least one sealing ring and outside of an outer circumferential edge of the substrate accommodated in the respective first single substrate process chamber and second single substrate process chamber.

8. The atomic layer deposition apparatus according to claim 1, wherein each of the first top and bottom parts and the second top and bottom parts comprise at least one gas inlet which is in fluid communication with the plurality of gas supply openings of the respective part.

9. The atomic layer deposition apparatus according to claim 8, wherein at least one of the first top and bottom parts and at least one of the second top and bottom parts comprise two gas inlets, wherein a first one of the two gas inlets is in fluid connection with a first subset of the plurality of gas supply openings and wherein a second one of the two gas inlets is in fluid connection with a second subset of the plurality of gas supply openings, and wherein the gas supply openings of the first subset are not part of the second subset and wherein the gas supply openings of the second subset are not part of the first subset.

10. The atomic layer deposition apparatus according to claim 1, further comprising a housing bounding a housing chamber in which the first and the second single substrate process chambers and the transfer mechanism are accommodated, the housing comprising:

a protective gas inlet connected to a protective gas source for supplying protective gas into the housing chamber;

a protective gas outlet connected to an exhaust for exhausting protective gas from the housing chamber.

11. The atomic layer deposition apparatus according to claim 1, wherein at least one of the first and second single substrate process chambers further comprises at least one conically shaped rotatable capstan, configured to engage an outer edge of the substrate and to rotate the substrate in the respective single substrate process chamber.

12. The atomic layer deposition apparatus according to claim 11, wherein the opposite facing surfaces of the first top and bottom parts and the second top and bottom parts are tilted over a tilt angle with respect to a horizontal direction so that gravity force urges the substrate against the at least one capstan.

13. The atomic layer deposition apparatus according to claim 12, wherein the tilt angle is less than 5°.

14. The atomic layer deposition apparatus according to claim 11, wherein at least one of the plurality of the gas supply openings of the first and the second single substrate process chambers is configured to supply, to the respective single substrate process chamber, a gas flow which has a directional component toward the capstan so that a drag force of the gas flow exerted on the substrate urges the substrate against the capstan.

15. A method for applying an atomic layer deposition (ALD) film on a substrate, the method comprising:

using the atomic layer deposition apparatus according to claim 1, subsequently executing the following steps a plurality of times until a desired film thickness on the substrate is achieved;

processing the substrate in a first process step in the first single substrate process chamber, transferring the substrate from the first single substrate process chambers to the second single substrate process chamber, processing the substrate in a second process step in the second single substrate process chamber, and transferring the substrate from the second single substrate process chamber to the first single substrate process chamber.

16. The method according to claim 15, wherein the first process step within the first single substrate process chamber is performed at a first temperature ($T_1$), and wherein the second process step within the second single substrate process chamber is performed at a second temperature ($T_2$).

17. The method according to claim 16, wherein the first temperature ($T_1$) differs from the second temperature ($T_2$).

18. The method according to claim 16, wherein the first temperature ($T_1$) is the same as the second temperature ($T_2$) and wherein a first precursor gas supplied in the first single substrate process chamber is different from a second precursor gas supplied in the second single substrate process chamber.

19. The method according to claim 17, wherein the method is a two-temperature AB-type ALD, in that a first precursor (A) is supplied in the first single substrate process chamber and a second precursor (B) is supplied in the second single substrate process chamber.

20. The method according to claim 17, wherein the method is a two-temperature ABC-type ALD, wherein:
the first process step comprises exposing the substrate to a precursor (A), which is supplied in the first single substrate process chamber maintained at the first temperature ($T_1$), and
the second process step comprises exposing the substrate to a second precursor (B) and subsequently to a third precursor (C), wherein the second precursor (B) and the third precursor (C) are subsequently supplied in the second single substrate process chamber maintained at the second process temperature ($T_2$).

21. The method according to claim 17, wherein the method is a two-temperature ABC-type ALD, wherein:
the first process step comprises exposing the substrate to a first precursor (A), and subsequently to a second precursor (B), which first precursor (A) and second precursor (B) are subsequently supplied in the first single substrate process chamber maintained at the first process temperature ($T_1$); and
the second process step comprises exposing the substrate to a third precursor (C), which is supplied in the second single substrate process chamber maintained at the second process temperature ($T_2$).

22. The method according to claim 17, wherein the method is a two-temperature supercycle ALD, wherein:
the first process step comprises exposing the substrate to several cycles of ALD in the first single substrate process chamber maintained at the first temperature ($T_1$), wherein a growth area is formed on the substrate and
the second process step comprises removing unwanted deposition from a non-growth area in the second single substrate process chamber maintained at the second temperature ($T_2$), by exposing the non-growth area to an etching gas.

23. The method according to claim 15, wherein at least in one of the first and the second single substrate process chambers a first precursor gas (A) and a second precursor gas (B) are subsequently supplied via the gas supply openings to perform subsequent ALD-cycles, separated by a supply of purge gas via the gas supply openings,
wherein a total of flows of the purge gas, the first precursor gas (A), and the second precursor gas (B) is kept constant during each process step within the respective single substrate process chamber.

* * * * *